United States Patent [19]
Honjo

[11] Patent Number: 5,473,281
[45] Date of Patent: Dec. 5, 1995

[54] AMPLIFIER CIRCUIT HAVING IMPEDANCE MATCHING CIRCUIT

[75] Inventor: Kazuhiko Honjo, Tokyo, Japan

[73] Assignee: NEC Corporation, Japan

[21] Appl. No.: 309,393

[22] Filed: Sep. 20, 1994

[30] Foreign Application Priority Data

Sep. 20, 1993 [JP] Japan ................... 5-233010

[51] Int. Cl.$^6$ .................................. H03F 3/60
[52] U.S. Cl. ............... 330/286; 330/302; 333/33
[58] Field of Search ......................... 330/286, 302, 330/305, 306, 307; 333/33

[56] References Cited

U.S. PATENT DOCUMENTS 5,352,990  10/1994  Goto ........................ 330/286
5,363,060  11/1994  Kohno ...................... 330/286

FOREIGN PATENT DOCUMENTS 64-44641  2/1989  Japan .

Primary Examiner—Steven Mottola
Attorney, Agent, or Firm—Ostrolenk, Faber, Gerb & Soffen

[57] ABSTRACT

An amplifier circuit having an impedance matching circuit coupled between a transistor having an element impedance of $Z_{Tr}$ and a first transmission line having a characteristic impedance of $Z_0$, the impedance matching circuit including a second transmission line having a characteristic impedance $Z_{T0} \approx (Z_{Tr} \times Z_0)^{1/2}$ and a length of a quarter wavelength, and a high-harmonic processing circuit disposed at the connection of the second transmission line to the first transmission line. The high-harmonic component processing circuit has two parallel stubs each having a certain characteristic impedance and a released tip end, the two parallel stubs having length of one-eighth wavelength and one-twelfth wavelength, respectively.

4 Claims, 5 Drawing Sheets

AMPLIFIER CIRCUIT HAVING IMPEDANCE MATCHING CIRCUIT

BACKGROUND OF THE INVENTION

1. Field of the Invention

The invention relates to an amplifier circuit, and more particularly to a high-efficiency amplifier circuit having an impedance matching circuit for high-harmonic signal components.

2. Description of the Related Art

It is important for a system using a transistor amplifier therein to enhance the electric power efficiency of the transistor amplifier. In particular, the enhancement in electric power efficiency is significantly needed for a portable system operating on a battery, as well as a satellite/space communication system. It is well known in the art that a transistor operating under a class-B biasing condition produces at an output node thereof a current that includes only even-high-harmonic components except for a fundamental wave component. Consequently, if such an arrangement would be made so that a voltage derived at the output node includes only odd-high-harmonic components, no power loss would take place in higher harmonics. A amplifier circuit having high-efficiency is thus derived.

In more detail, by designing a load impedance for even higher harmonics to be zero (0), no even-high-harmonic voltage component appears at the output node of the transistor. On the other hand, a load impedance for odd higher harmonics is designed to be large, preferably infinite, to obtain a voltage waveform. This voltage waveform is, however, not generated based upon the fundamental wave component, and not upon odd-high-harmonic current components, because the transistor produces the currents including only even-high-harmonic components as mentioned above. Thus, in order to enhance the power efficiency, such an impedance matching circuit is required in a transistor amplifier circuit that achieves in impedance matching with the fundamental wave component, an open state for odd higher harmonics and a short-circuit stage for even higher harmonics.

Based on the above mentioned technical concept, a transistor amplifier circuit as shown in FIG. 1 has been proposed. This amplifier circuit is disclosed in Japanese Unexamined Patent Public Disclosure No. 64-44611. In FIG. 1, an output terminal 34 of a transistor 31 is connected to one end of a line 33 having a one-eighth wavelength ($\lambda$/8) for a fundamental wave. This line 33 has the other end made open to thereby provide a quarter wavelength ($\lambda$/4) for a second high-harmonic component. The short-circuit state for the second high-harmonic component is thus performed. Since the one-eighth wavelength line 33 for the fundamental wave makes a capacitive stub, an output impedance of the transistor 31 is decreased lower than an intrinsic value thereof. Therefore, a matching circuit 32 is provided to match the output impedance thus decreased with a characteristic impedance $Z_0$ of a transmission line 35.

However, the transistor 31 includes, in general, a plurality of unit transistors connected in parallel to one another for the purpose of gaining current capacity. Each of the unit transistors has a small output impedance, so that the output impedance of the transistor 31 is inherently small. Such a small impedance is further lowered by the capacitive stub by the line 33, as disclosed before. For this reason, in spite of providing the matching circuit 32, the power loss is increased remarkably due to the resistances thereof. Moreover, the impedance matching cannot be carried out over a wide band.

SUMMARY OF THE INVENTION it is an object of the present invention to provide a high-efficiency amplifier circuit capable of fulfilling conditions necessary for a highly efficient operation for a Nth higher harmonic, wherein N is an integer and is arbitrarily selected, without decreasing an impedance in the vicinity of an element.

In one aspect of the invention, there is provided an amplifier circuit equipped with an impedance matching circuit to be coupled between a transistor having its impedance of $Z_T$, and a first transmission line having a characteristic impedance of $Z_0$. The impedance matching circuit includes a second transmission line disposed between an output terminal of the transistor and the first transmission line. The second transmission line has a characteristic impedance of $Z_{T0} \approx (Z_T \times Z_0)^{1/2}$ and a length of a quarter wavelength, and a higher harmonic processing circuit disposed at the connection of the second transmission line to the first transmission line. The higher harmonic processing circuit has two parallel stubs each having a certain characteristic impedance and an open tip end, and the two parallel stubs have length of a one-eighth wavelength and a one-twelfth wavelength, respectively.

According to another aspect of the present invention, an amplifier circuit includes a second transmission line disposed between a terminal of a transistor and a first transmission line. The second transmission line has a characteristic impedance of $Z_{T0} \approx (Z_T \times Z_0)^{1/2}$ and a length of a quarter wavelength, and a higher harmonic processing circuit disposed at the connection of the second transmission line to the first transmission line. The higher harmonic processing circuit has N parallel stubs each having an open tip end. Each of the parallel stubs have a length L defined by the following equation:

$$L=\lambda/4(1+m)$$

wherein $\lambda$ represents a wavelength, and m represents an integer ranging from one (1) to N.

In a preferred embodiment, the high output transistor and the second transmission line are monolithic integrated on a semi-insulating compound semiconductor substrate, and the higher harmonic processing circuit and the first transmission line are located on a dielectric substrate.

With the aforementioned structure, it is possible to dispose a fundamental wave matching circuit between a transistor and a higher harmonic processing circuit. As a result, it is possible to avoid an unnecessarily lowered impedance of the transistor to thereby reduce a conductor loss.

Further, the impedances representing a short-circuit state for a second high-harmonic component and an open state for a third high-harmonic component are formed at an output of a transistor, to thereby have a highly efficient operation.

In addition, the invention provides a highly efficient amplifier circuit which fulfills conditions for a highly efficient operation with respect to a Nth higher harmonic as well as second and third higher harmonics.

In mounting, it is possible to compose a fundamental wave matching circuit as a GaAs monolithic integrated circuit and to mount a higher harmonic processing circuit and a 50 $\Omega$ transmission line on an alumina substrate. Accordingly, it is possible to provide a circuit which can compensate for a defect of a monolithic integrated circuit

3 which would be otherwise required to make fine adjustments.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
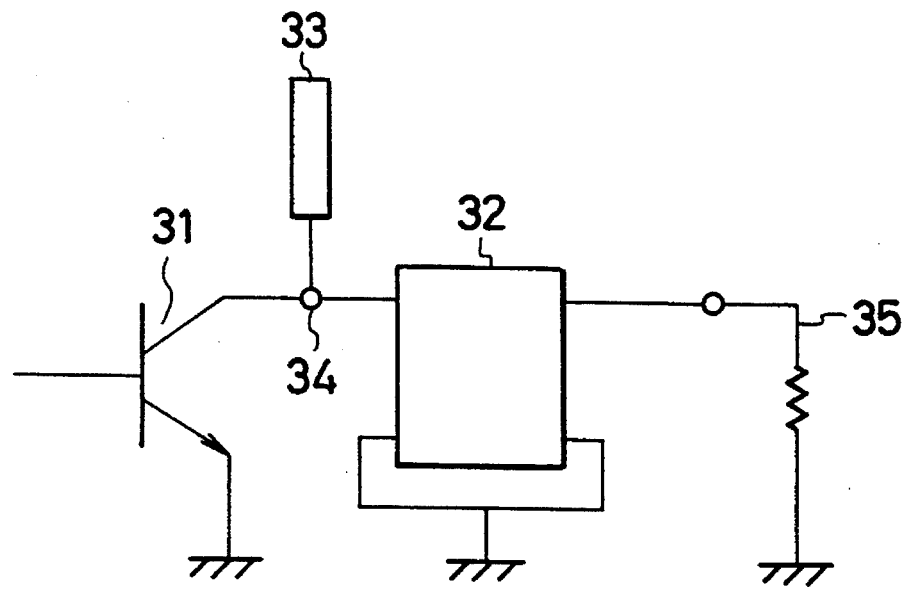
FIG. 1 is a schematic circuit diagram of a conventional highly efficient amplifier circuit.
Figure 2:
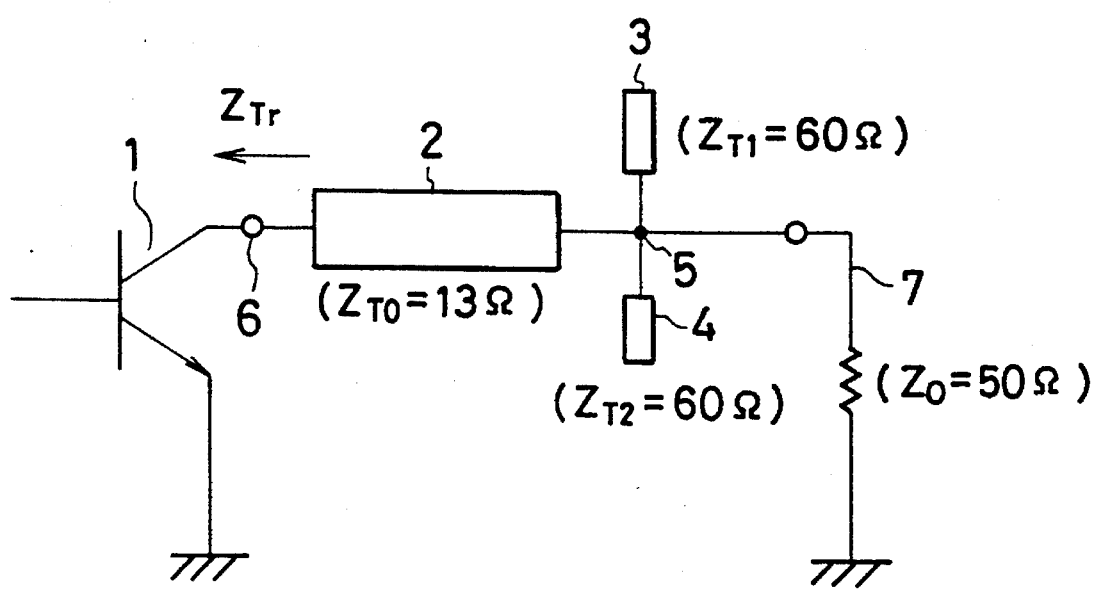
FIG. 2 is a schematic circuit diagram of a highly efficient amplifier circuit in accordance with a first embodiment of the invention.

Referring to FIG. 2, a high-efficiency amplifier circuit according to a first embodiment of the present invention has a transistor 1 having an output terminal 6 to which is connected in series a line 2 having a length of a quarter wavelength ($\lambda/4$) and also having a characteristic impedance of $Z_{T0} \approx (Z_T \times Z_0)^{1/2}$. At a point 5 at which a transmission line 7 having a characteristic impedance of $Z_0$ and the line 2 are connected to each other, are disposed a line 3 having a characteristic impedance of $Z_{T1} \approx 60$ ohms, a length of a one-eighth wavelength ($\lambda/8$) and an open end, and a line 4 having a characteristic impedance of $Z_{T2} = 60$ ohms, a length of a one-twelfth wavelength ($\lambda/12$) and an open end.

A second high-harmonic component is short-circuited at the point 5 due to the $\lambda/8$ line 3, and a third high-harmonic component is also short-circuited at the point 5 due to the $\lambda/12$ line 4. Since the $\lambda/4$ line 2 serves as a one-half wavelength ($\lambda/2$) transmission line for the second high-harmonic component, an impedance of the second high-harmonic component is zero (0) at the output terminal 6 of the transistor 1. On the other hand, since the $\lambda/4$ line 2 serves as a three-fourths wavelength ($3\lambda/4$) transmission line for the third high-harmonic component, an impedance of the third high-harmonic component is infinite at the output terminal 6 of the transistor 1.

An output impedance of a transistor for a fundamental wave is "3.2–j 2.3 [$\Omega$]" in a transistor having a 30 GHz band and a 1 W output. This output impedance can be converted to about 50 ohms impedance by the $\lambda/4$ line 2 having a characteristic impedance $Z_{T0}=$ 13 ohms. After the impedance conversion is completed, a capacity derived from the $\lambda/8$ line 3 and the $\lambda/12$ line 4 is added.

Figure 3:
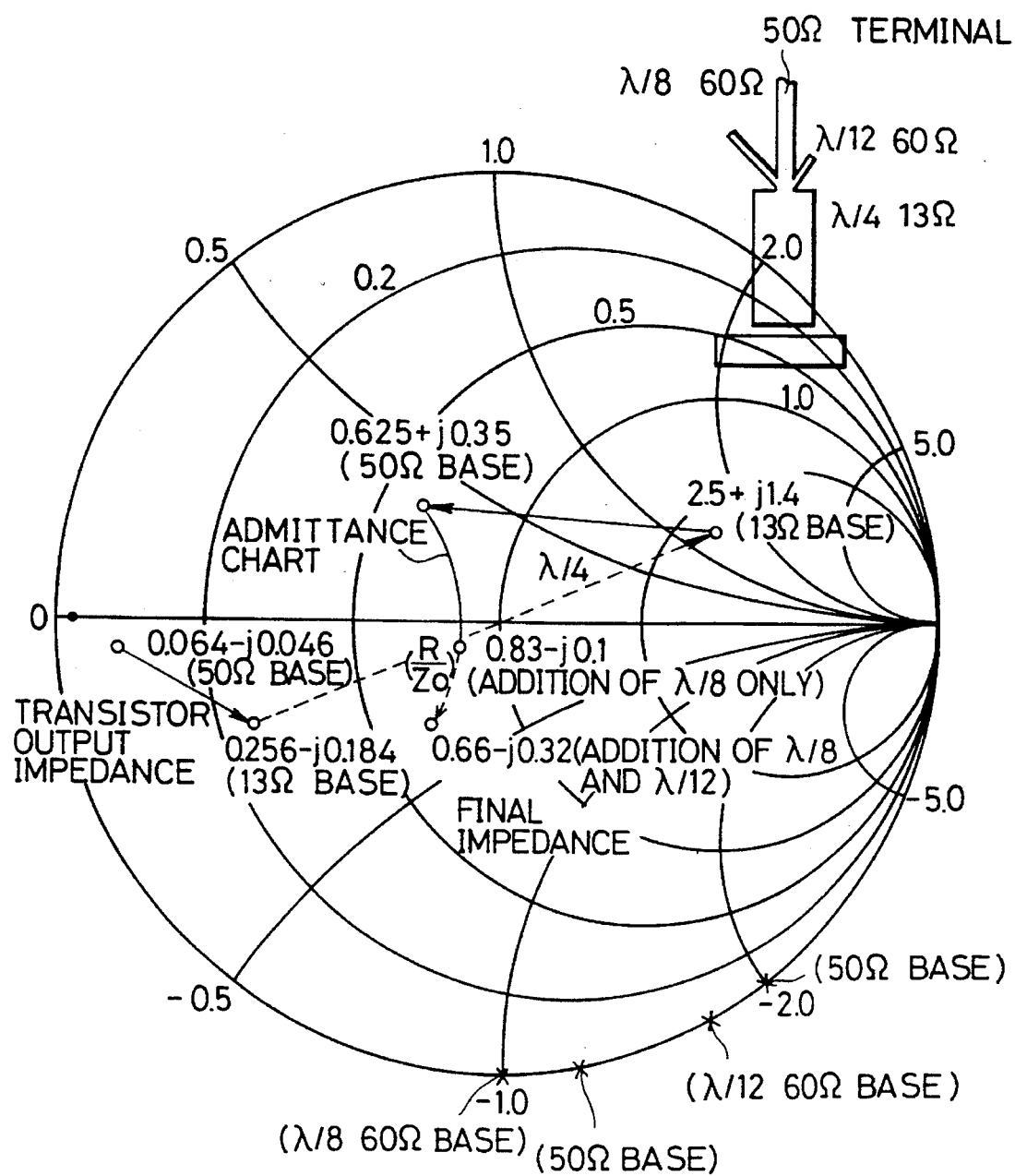
FIG. 3 is a Smith chart for explaining the first embodiment illustrated in FIG. 2.

The foregoing will be explained hereinbelow with reference to a Smith chart illustrated in FIG. 3. The output impedance "3.2–j 2.3 [$\Omega$]" of the transistor 1 is represented as "0.064–j 0.046 [$\Omega$]" in a Smith chart standardized with 50 ohms. This standardized element impedance can be converted to "0.625+j 0.35 [$\Omega$]" through the $\lambda/4$ transmission line 2 having a characteristic impedance of 13 ohms. This impedance is equivalent to "1.18–j 0.7 [$\Omega^{-1}$]" in an admittance chart. An input impedance of the stub 3 having a characteristic impedance of 60 ohms, a length of $\lambda/8$ and an open end is equivalent to "–j 1.2", which is equivalent to "+j 0.84" in admittance, and similarly an input impedance of a stub having a length of $\lambda/12$ and an open end is equivalent to "–j2.0", which is equivalent to "+j 0.5" in admittance. Thus, a total admittance is calculated as follows.

$$1.18-j\ 0.7 + j\ 0.84 + j\ 0.5 = 1.18 + j\ 0.64\ [\Omega^{-1}]$$

This total admittance is equivalent to "0.66–j 0.32 [$\Omega$]" in impedance. The destandardized value of this impedance makes "33–j 16 [$\Omega$]", which approximately matches with 50 $\Omega$-based system. A standing-wave ratio (VSWR) in this case is 1.8.

Figure 4:
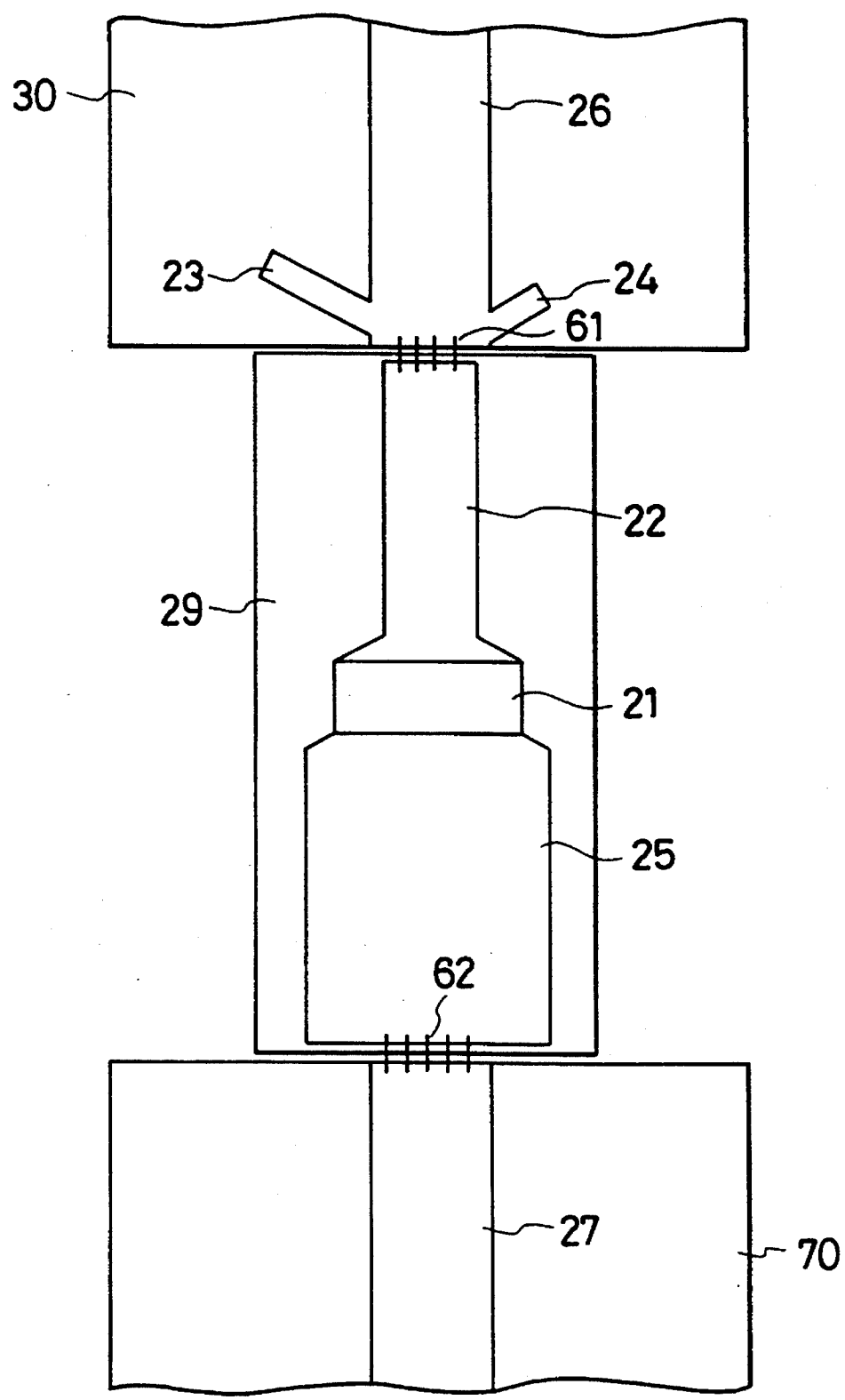
FIG. 4 is a plan view illustrating a first example of mounting a highly efficient amplifier circuit in accordance with the first embodiment illustrated in FIG. 2.

FIG. 4 shows a first example incorporating the amplifier circuit in accordance with the first embodiment. On a semi-insulating GaAs substrate 29 having 30 micrometers of thickness are disposed a high output heterobipolar transistor (HBT) element 21 having 1 Watt class output, and a transmission line 22 located on the side of an output of the HBT element 21, having a characteristic impedance of 13 ohms and a length of a quarter wavelength when measured at 26 GHz. On the side of an input of the HBT element 21 is disposed a transmission line 25 having a characteristic impedance of 7 ohms and a length of a quarter wavelength when measured at 26 GHz.

The transmission line 22 is connected through bonding wires 61 to a 50 $\Omega$ microstrip line 26 disposed on an alumina substrate 30 having a thickness of 0.25 mm and having a $\lambda/8$ parallel stub 23 and a $\lambda/12$ parallel stub 24.

The transmission line 25 is connected through bonding wires 62 to a 50 $\Omega$ microstrip line 27 disposed on an alumina substrate 70 having a thickness of 0.25 mm.

Figure 5:
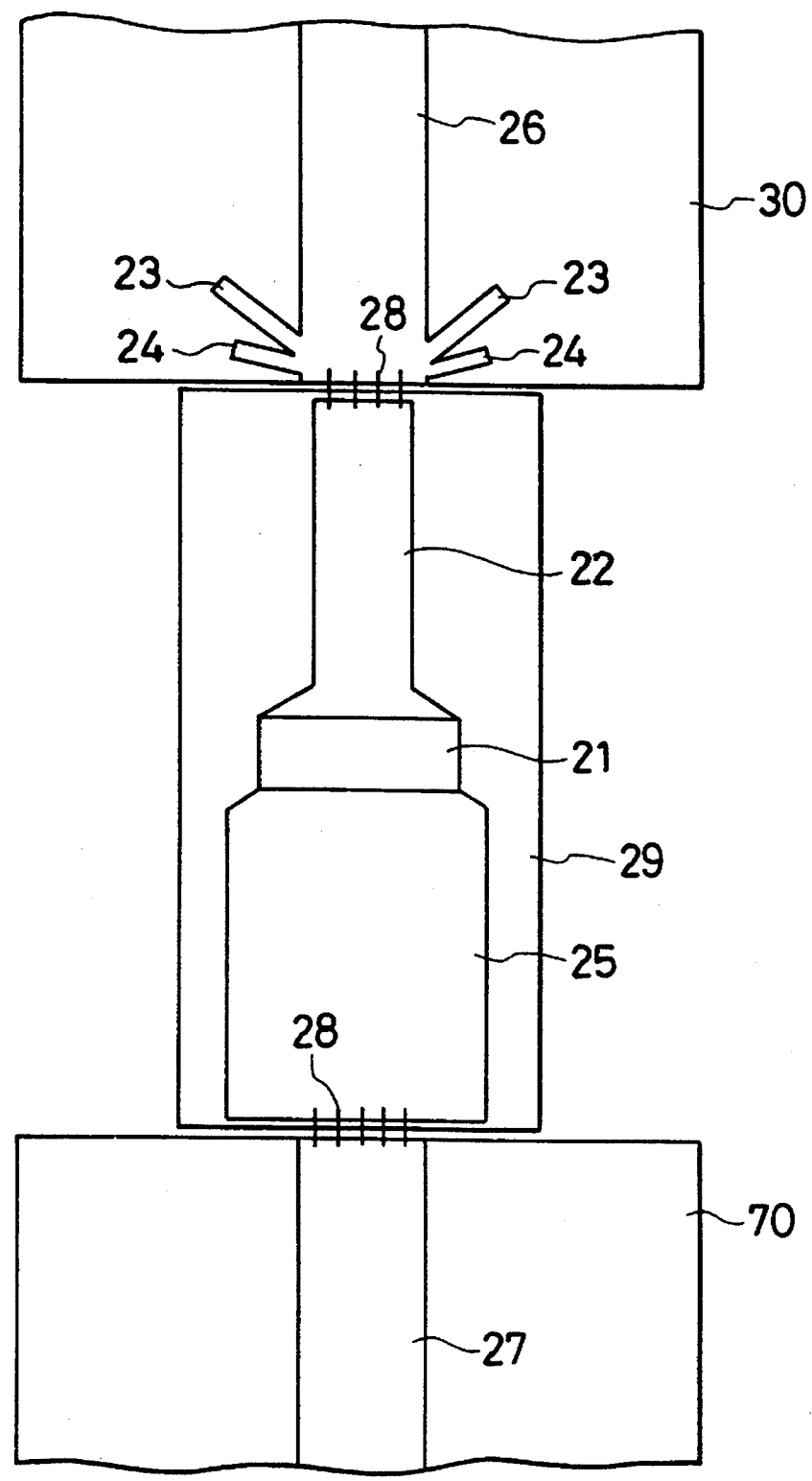
FIG. 5 is a plan view illustrating a second example of mounting a highly efficient amplifier circuit in accordance with the first embodiment illustrated in FIG. 2.

FIG. 5 shows a second example incorporating the amplifier circuit in accordance with the first embodiment. A difference from the first example illustrated in FIG. 4 is that each of the parallel stubs 23 and 24 for trapping high-harmonic component in the second example is divided into two stubs. The other structure than the divided parallel stubs 23 and 24 is the same as the first example, and thus the same elements have been provided with the same reference numerals as those in the first example illustrated in FIG. 4.

By arranging two parallel stubs on the opposite sides of the microstrip line 26, it is possible to keep a balance while the circuit is being operated.

The first embodiment as aforementioned is effective to second and third high-harmonic components.

Next, hereinbelow will be explained a second embodiment of a high efficient amplifier circuit which fulfills conditions for a highly efficient operation against a Nth high-harmonic component.

Figure 6:
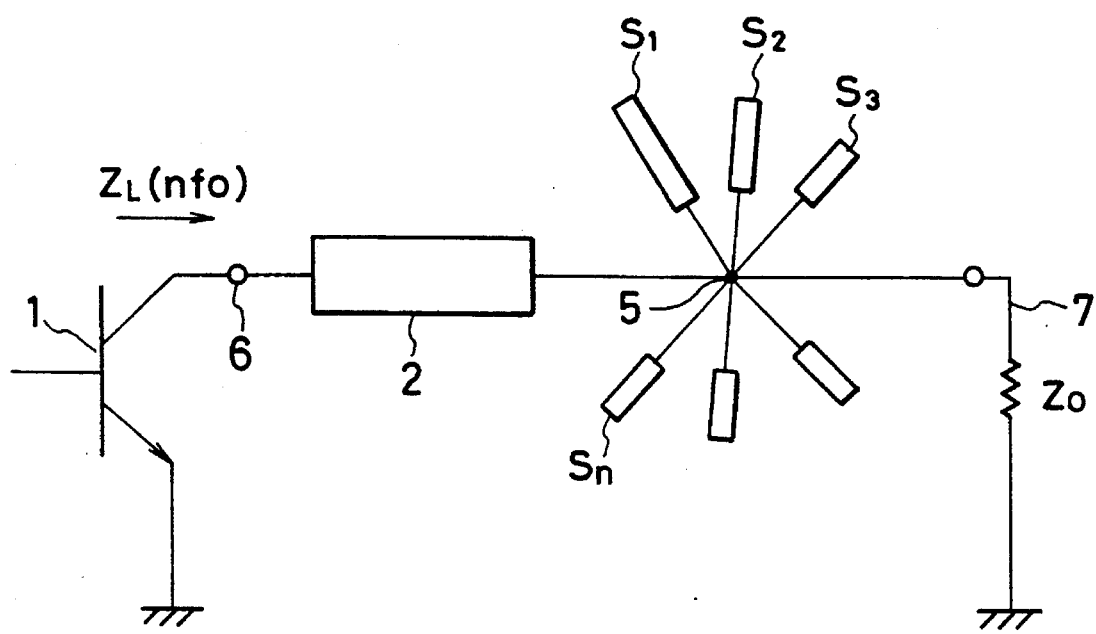
FIG. 6 is a schematic circuit diagram of a highly efficient amplifier circuit in accordance with a second embodiment of the invention.

FIG. 6 illustrates the second embodiment. The amplifier circuit has a transistor 1 having an output terminal 6 to which is connected in series a line 2 having a length of a quarter wavelength ($\lambda/4$) and also having a characteristic impedance of $Z_{T0} \approx (Z_T \times Z_0)^{1/2}$. At a point 5, a transmission line 7 having a characteristic impedance of $Z_0$ is connected to the line 2, and also connected in parallel are N stubs $S_1$, $S_2$, ..., $S_n$ each having an open tip end.

Each of the parallel stubs has a length L defined by the following equation.

$$L = \lambda/4(1+m)$$

wherein $\lambda$ represents a wavelength, and m represents an integer ranging from one (1) to N.

With respect to the second embodiment, an impedance ZL of the transistor is shown in Table 1 when viewing the λ/4 line 2 from the output 6 of the transistor 1, for an equivalent length of the λ/4 line 2, for an electrical length of the λ/4 line 2, and for a frequency and a length of each stub.

TABLE 1

| $Z_L$ | EQUIVALENT LENGTH OF THE LINE 2 | ELECTRICAL LENGTH OF THE LINE 2 | FREQUENCY | STUB $S_1$ | STUB $S_2$ | STUB $S_3$ | STUB $S_4$ | ... | STUB $S_n$ |
|---|---|---|---|---|---|---|---|---|---|
| WATCHING | λ/4 | λ/4 | fo | λ/8 | λ/12 | λ/16 | λ/20 | ... | λ/4 (1 + n) |
| 0 | 0 | λ/2 | 2fo | λ/4 | | | | | |
| ∞ | λ/4 | λ/2 + λ/4 | 3fo | | λ/4 | | | | |
| 0 | 0 | λ | 4fo | | | λ/4 | | | |
| ∞ | λ/4 | λ + λ/4 | 5fo | | | | λ/4 | | |
| 0 | 0 | λ + λ/2 | 6fo | | | | | | |
| ∞ | λ/4 | ½λ + λ/4 | 7fo | | | | | | |
| . | | | | | | | | | |
| . | | | (n + 1)fo | | | | | | λ/4 |

It can be understood from the impedances ZL for the Nth high-harmonic component shown in Table 1 that F-class matching has been perfectly accomplished.

It is obvious to those skilled in the art that the second embodiment may be mounted in a fashion as illustrated in FIG. 4.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. An amplifier circuit having an impedance matching circuit coupled between a transistor having an element impedance of $Z_{Tr}$ and a first transmission line having a characteristic impedance of $Z_0$, said impedance matching circuit comprising:

a second transmission line disposed between a terminal of said transistor and said first transmission line, said second transmission line having a characteristic impedance of $Z_{T0} \approx (Z_{Tr} \times Z_0)^{1/2}$ and a length of a quarter wavelength; and a higher harmonic processing circuit disposed at the connection of said second transmission line to said first transmission line, said higher harmonic processing circuit having two parallel stubs each having a certain characteristic impedance and an open tip end, said two parallel stubs having length of a one-eighth wavelength and a one-twelfth wavelength, respectively.

2. An amplifier circuit having an impedance matching circuit coupled between a transistor having an element impedance of $Z_{Tr}$ and a first transmission line having a characteristic impedance of $Z_0$, said impedance matching circuit comprising:

a second transmission line disposed between a terminal of said transistor and said first transmission line, said second transmission line having a characteristic impedance of $Z_{T0} \approx (Z_{Tr} \times Z_0)^{1/2}$ and a length of a quarter wavelength; and a higher harmonic processing circuit disposed at the connection of said second transmission line to said first transmission line, said higher harmonic processing circuit having N parallel stubs each having an open tip end, each of said parallel stubs having a length L defined by a following equation:

$$L = \lambda/4(1+m)$$

wherein λ represents a wavelength, and m represents an integer ranging from one (1) to N.

3. The amplifier circuit as recited in claim 1, wherein said transistor and said second transmission line are monolithic integrated on a semi-insulating compound semiconductor substrate, and said higher harmonic processing circuit and said first transmission line are located on a dielectric substrate.

4. The amplifier circuit as recited in claim 2, wherein said transistor and said second transmission line are monolithic integrated on a semi-insulating compound semiconductor substrate, and said higher harmonic processing circuit and said first transmission line are located on a dielectric substrate.

* * * * *